United States Patent [19]

Naber

[11] Patent Number: 5,420,527

[45] Date of Patent: May 30, 1995

[54] TEMPERATURE AND SUPPLY INSENSITIVE TTL OR CMOS TO 0/-5 V TRANSLATOR

[75] Inventor: John F. Naber, Goodview, Va.

[73] Assignee: ITT Corporation, New York, N.Y.

[21] Appl. No.: 223,544

[22] Filed: Apr. 6, 1994

[51] Int. Cl.6 .......................... H03K 19/0175
[52] U.S. Cl. ........................ 326/32; 326/68; 326/116; 327/378
[58] Field of Search ............... 307/475, 443, 448, 451, 307/310, 450

[56] References Cited

U.S. PATENT DOCUMENTS

| | | | |
|---|---|---|---|
| 4,490,632 | 12/1984 | Everett et al. | 307/475 |
| 4,661,726 | 4/1987 | Blard | 307/450 |
| 4,743,782 | 5/1988 | Nelson et al. | 307/475 |
| 4,812,683 | 3/1989 | Fitzpatrick et al. | 307/448 |
| 4,857,769 | 8/1989 | Kotera et al. | 307/450 |
| 5,051,626 | 9/1991 | Kajil | 307/475 |
| 5,128,556 | 7/1992 | Hirakata | 307/448 |
| 5,323,071 | 6/1994 | Hirayama | 307/475 |

Primary Examiner—Edward P. Westin
Assistant Examiner—Stephen Calogero
Attorney, Agent, or Firm—Arthur L. Plevy; Patrick M. Hogan

[57] ABSTRACT

Voltage translator apparatus to translate TTL or CMOS logic level inputs to 0/−5 V logic levels that is insensitive to temperature and bias supply variation. A unique circuit structure comprises a level shift stage employing transistors configured to level shift a source of operating potential to a controlling potential to be applied to a predriver stage. The controlling potential is a function of the input logic levels. The predriver stage drives an output stage capable of providing complementary 0/−5 V logic outputs. The configuration is such as to afford low power consumption as well as proper operation over wide bias supply and temperature ranges.

19 Claims, 3 Drawing Sheets

TEMPERATURE AND SUPPLY INSENSITIVE TTL OR CMOS TO 0/-5 V TRANSLATOR

FIELD OF THE INVENTION

This invention relates in general to voltage level translators to translate TTL or CMOS logic levels to 0/−5 V levels for controlling microwave FETs and the like, and more particularly to a low power consumption translator that is temperature and bias voltage supply insensitive.

BACKGROUND OF THE INVENTION

Devices such as microwave field effect tranistors (FETs) are used in a variety of applications such as switching, amplification, attenuation, phase shifting, etc. These devices are controllable by logic level inputs of 0 and −5 volts. Often, such devices are interfaced with digital control circuitry employing transistor-transistor logic (TTL) or complementary metal oxide semiconductor (CMOS) logic. TTL logic levels are typically +3.6 and ØV; and CMOS logic levels are typically +5 and 0 V. A TTL logic "0", however, may be as high as 1 V, and a TTL logic "1" V may be as low as 2 V. Thus there has been a need for a voltage translator designed to translate the range of TTL and/or CMOS logic levels to 0/−5 V levels in a single circuit.

Conventional prior art translators such as the CMOS to 0/−5 V level translator shown in FIG. 1 typically employ schottky diodes and MESFETS. These translators suffer from the problems of poor temperature and bias supply sensitivity, and excessive power dissipation. Poor bias supply sensitivity over temperature is due largely to the mismatch in temperature coefficients between the schottky diodes and MESFETS.

Ideally, the translator should be able to translate the input logic to the desired 0/−5 V outputs with bias supply voltages that are allowed to vary approximately ±20% over temperature or otherwise. Conventional translators such as that of FIG. 1 can generally come close to providing proper outputs with this bias supply Variation at room temperature. However, as the temperature varies over a moderate range, for example, from −10° to +80° C., proper circuit performance is provided only if the bias voltages remain at their nominal design value within about ±10%

Thus, at a nominal temperature such as room temperature, a conventional translator design takes into account presupposed I-V characteristics of the diodes, and Ids vs. Vds, Vgs curves of the MESFETS to arrive at an allowable bias voltage range of operation. Within this allowable range, the output logic levels fall into an established tolerance range to enable output logic states to be distinguished. Also, the outputs will change state when the input logic level reaches a predetermined switching voltage level. When the supply voltage varies to a value outside the allowable range, the output states will no longer change state in accordance with a change in the input logic state. As the temperature varies significantly off the nominal temperature, the I-V and Ids vs. Vds, Vgs curves undergo an incompatible change in characteristics such that the allowable bias voltage range of operation is narrowed substantially.

Another prior art drawback is excessive power consumption. Ideally, it would be desirable for an entire translator circuit to draw about 1 mA over a moderate temperature range of about −10° C. to +80° C. However, it is not uncommon for a conventional translator to draw 3 mA or more over this temperature range.

One major contributor to the power consumption is the inclusion of voltage divider network 18 as shown in FIG. 1 which generates an intermediate bias voltage Vss of about −3 V. The bias voltage Vss is essential to the operation of the prior art translator. A supply voltage Vcc of about +5 V is translated by the FET Q1 and the string of diodes D1 down to a potential close to the Vss potential at circuit node A. The input logic level at Vin is determinative of the potential at node A, and in turn, FET Q3 is turned ON or OFF, thereby impacting the state of FET Q4. Diodes D2 and FET Q2 then serve to control the voltage at circuit node B which is determinative of the complementary output states OUTA and OUTB. Another source of excessive power consumption is the buffer diode FET logic (BDFL) stage 19 preceding the output stage. The BDFL stage aids in the current driving capability of the translator. The intermediate supply voltage Vss is also coupled to this stage as well as to the inverter 14.

Another problem with conventional translator designs is that circuit performance with bias supply variation over a wide temperature range is degraded for designs that attempt to accommodate both TTL and CMOS input logic. For example, the circuit of FIG. 1. is optimized for CMOS input logic wherein a logic high is about 2.7 V, minimum. Accordingly, the circuit is designed to switch output states when the input logic level rises past a threshold of about 2.5 V. Over a moderate temperature range, such a circuit can operate with bias supply variation of about 10%. This translator may be redesigned to lower the switching threshold to about 1.8 V in order to accommodate TTL input logic, which may be as low as 2.0 V. In this case, however, a limited bias supply variation of substantially less than 10% can be tolerated over the temperature range. To achieve the same 10% bias supply tolerance range over temperature for a TTL translator, a separate design would be required which would be unable to also accommodate the higher CMOS input potentials.

Therefore, it is an object of the present invention to provide a temperature and bias supply insensitive level translator to translate input logic of either TTL or CMOS logic levels to 0/−5 V levels in a single circuit.

It is a further object of the present invention to provide a low power consumption level translator.

SUMMARY OF THE INVENTION

The present invention relates to an improved voltage translator apparatus employing transistors configured in a unique circuit configuration to provide operation that is insensitive to bias supply variations over a wide temperature range. The translator is operative to translate TTL and/or CMOS logic level inputs wherein a low logic level input is translated to a low logic level output of a first different potential which may be minus five volts, and a high logic level input is translated to a high logic level output of a second different potential, which may be zero volts. The improved translator comprises first and second circuit parts and an output stage.

The first circuit part includes a first transistor having an input control electrode adapted to be connected to receive the logic level inputs, and having first and second output electrodes. A third source of operating potential is applied to the first output electrode. The second output electrode is coupled to a first series string of transistors, each of which is connected to conduct current in a unidirectional manner. The potential at the first output electrode is level shifted to a fourth potential at a first circuit node within the first circuit part. The magnitude of this fourth potential is a function of the magnitude of the logic level input potential.

The second circuit part includes a second transistor having a second control electrode coupled to the first circuit node where the fourth potential is applied. A fifth source of potential is applied to a third output electrode of the second transistor. A fourth output electrode of the second transistor is coupled to a second series string of at least one transistor, where each transistor in the second string is connected to conduct current in a unidirectional manner. The second series string is coupled to a point of reference potential. The second circuit part provides a sixth potential at a second circuit node, wherein the magnitude of the sixth potential is a function of the magnitude of the fourth potential.

The output stage includes at least one transistor adapted to be connected to the fifth source of operating potential, and at least one other transistor coupled to a point of reference potential. The output stage is coupled to the second circuit node, and provides the low and high logic level output potentials in accordance with the magnitude of the sixth potential at the second circuit node.

DETAILED DESCRIPTION OF THE INVENTION

Figure 2:
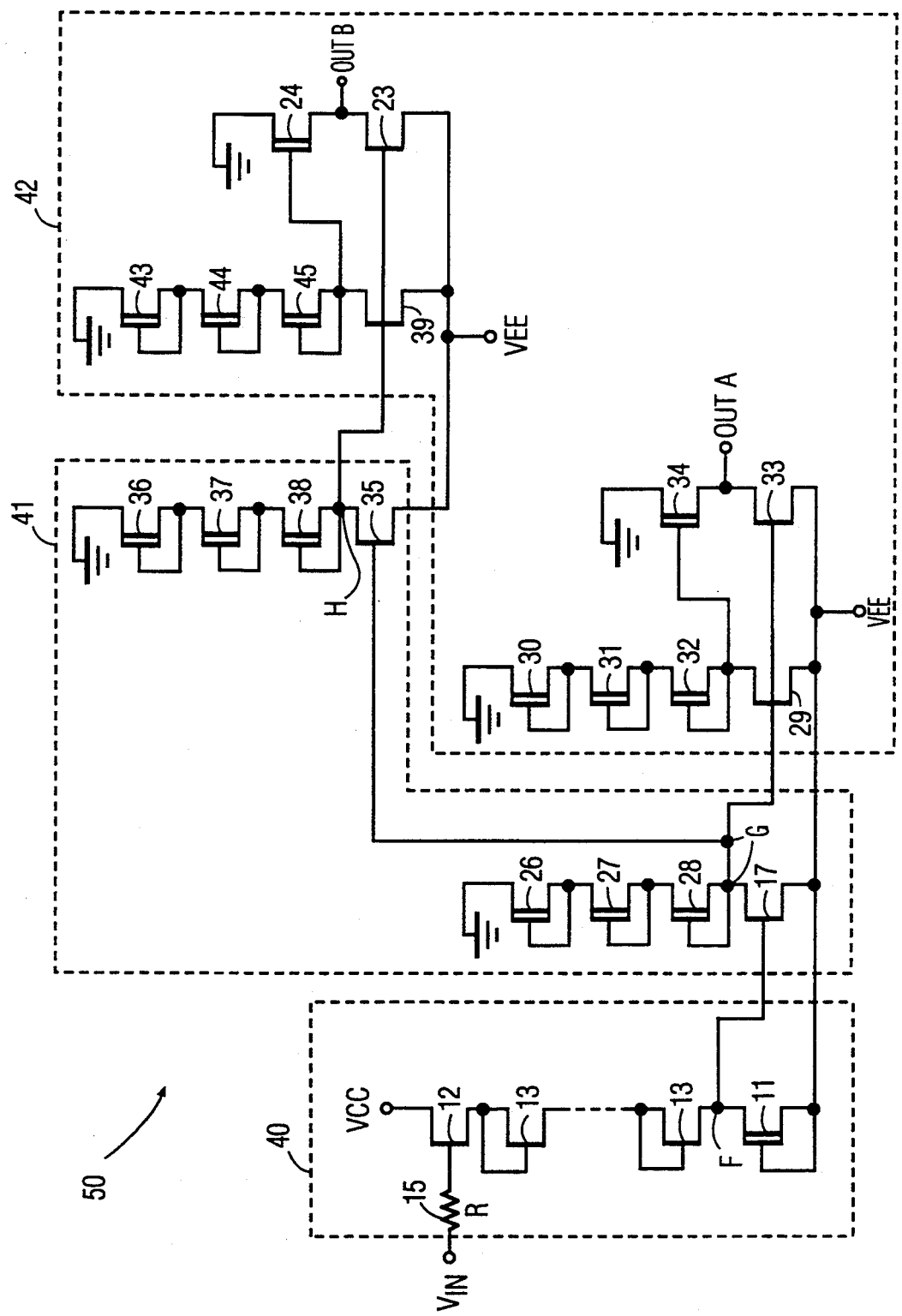
FIG. 2 shows a circuit diagram of a temperature and bias supply insensitive TTL or CMOS to 0/−5 V level translator according to the present invention.

Referring to FIG. 2, a voltage potential $V_{IN}$ representing either a TTL or CMOS logic level is applied to one terminal of a resistor 15. The circuit 50 provides complementary 0/−5 V logic level outputs designated OUTA and OUTB. OUTA and OUTB may represent binary "1" and binary "0" logic level inputs for controlling microwave FETS. If a TTL or CMOS logic "0" in the range of about 0–1 V is input at $V_{IN}$, the OUTA signal will be −5 V and the OUTB signal will be 0 V. If $V_{IN}$ is greater than about 1.8 V, thus representing either a TTL or CMOS logic "1", then OUTA will be 0V and OUTB will be −5 V.

The circuit 50 may be broken down into three stages: a level shift stage 40, a predriver stage 41 and an output stage 42. Each stage employs transistors which are preferably n-channel MESFET's fabricated on a GaAs substrate. Both enhancement mode and depletion mode FETs are utilized. The devices could also be fabricated on a silicon substrate. P-channel MESFETS could alternatively be employed, but suffer a disadvantage inasmuch as the switching speeds of p-channel devices are substantially slower than those of n-channel FETs. Other alternatives include employing MOSFET devices or bipolar devices.

The level shift stage 40 operates to shift the TTL or CMOS input voltage level down to a negative voltage $V_F$ at node F. $V_F$ is applied to the gate of enhancement mode FET 17 of the predriver stage 41. When $V_{IN}=$ 0–1.8 V, the level shift stage 40 forces $V_F$ to nearly equal Vee, where Vee is the bias voltage applied to the source of FET 17. This condition will assure that FET 17 is turned OFF. When a TTL or CMOS logic high of $V_{IN}=1.8-5$ V is applied, $V_F$ is forced to a potential of about (Vee+0.7) V, thus assuring that FET 17 is turned ON.

Detailed circuit operation is as follows. For this discussion, all the transistors are assumed to be n-channel FETS. A first supply voltage Vcc on the order of +5 V is applied to the drain of enhancement mode FET 12. The current limiting resistor 15, preferably of about 5K Ω, has one terminal coupled to the gate of FET 12, and another terminal connected to receive the TTL or CMOS input logic. A second bias voltage Vee is applied to the source of FET 17. Vee is nominally −5 V and may vary from −4 to −6 V, i.e., a ±20% variation, over a temperature range of about −10° C. to +80° C. The circuit 50 will continue to perform properly with this 20% variation in Vee over temperature. Moreover, large variations in Vcc of about ±20% can also be tolerated.

FET 12 is coupled in series with a string of level shifting enhancement mode FETs 13 and a current source FET 11 between the voltage source Vcc and ground potential. FET 11 is a depletion mode FET having its gate coupled to its source and its source coupled to receive Vee. With this configuration, FET 11 behaves as a variable current source, thereby enabling the aforementioned large swings in Vcc over temperature to be tolerated.

Each of level shifting FETs 13 have their gates coupled to their respective drains. FETs configured in this manner conduct current in a unidirectional manner from drain to source, and have Vds drops ranging from about 0.1–0.7 V. Each FET connected in series may thus be perceived as a variable resistor in a resistive divider network. Hence, as long as a small amount of current flows, a voltage drop occurs across the drain to source of each of FETs 13 and FET 12. As will be seen, the voltage Vcc is thus level shifted from a +5 V potential down to a potential $V_F$ at node F of about −5 V when the input logic is low, and of about −4.3 V when the input logic is high.

When $V_{IN}$ is in the range of 0–1.8 V, the gate to source voltage of FET 12 ($Vgs_{12}$) is less than zero and hence FET 12 is OFF. FET 12 may then be said to be in a high resistance state such that even though the FET 12 drain to source current ($Ids_{12}$) is low, a relatively large drain to source drop, $Vds_{12}$ is produced. Each of the level shifting FETs 13 then progressively shift the FET 12 source voltage down to about −5 V at node F. The number of level shifting FETs 13 employed depends upon the Ids vs Vds, Vgs characteristics of the FETs 13, 11 and 12, the supply voltage Vcc, the value of the limiting resistor 15, and the desired state switching voltage. (We have been assuming a 1.8 V input logic threshold voltage in which the output state changes from low to high or high to low, but this can be tailored to a particular design objective.) A typical design may employ, for example, 13 level shifting FETs 13, such that with $V_{IN}=0-1.8$ V, the drain to source voltage of each FET 13 and of FET 12 is 0.71 V. The voltage $V_F$ is then close to −5 V. Turn-on of FET 17 is then prevented by $Vgs_{17}$ being close to zero.

When $V_{IN}$ is in the range of 1.8–5 V, the node voltage $V_F$ is pulled up to a value greater or equal to (Vee+0.7 V) to enable turn on of FET 17. As the 1.8 V input voltage threshold is reached, $Vgs_{12}$ becomes more positive to allow FET 12 to start turning on. The effective series resistance of FET 12 is then reduced, resulting in a smaller $V_{ds12}$ drop even though the current $I_{ds12}$ goes up. Thus the voltage potential at the source of FET 12 is raised, thereby pulling up the potential $V_F$ through the level shifting FETs 13.

As the temperature varies over a wide range of, for example, $-10°$ C. to $+80°$ C., the Ids vs. Vds, Vgs curves of the FETs 11, 12 and 13 track each other. Thus the performance of the circuit 50 over temperature remains relatively constant. This is in sharp contrast to a conventional translator which employs diodes as the level shifting devices because the I-V characteristics of the diodes is highly sensitive to temperature variations, thereby degrading circuit performance.

Figure 3:
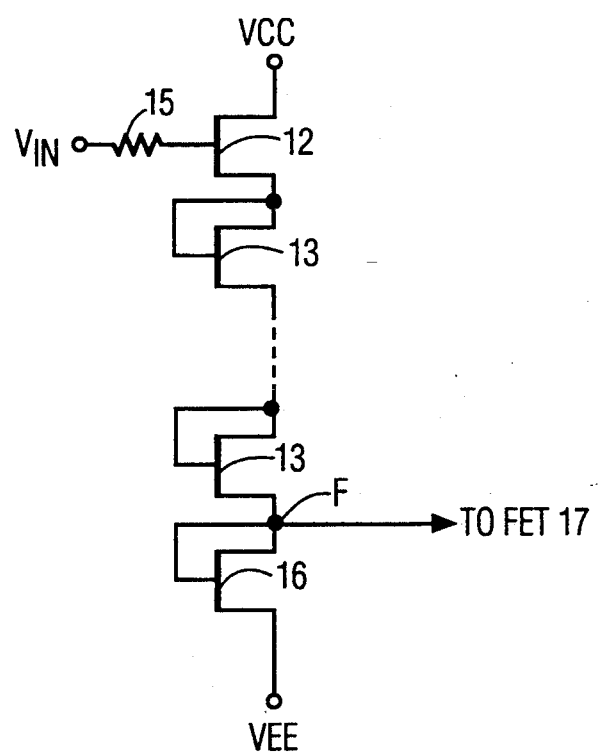
FIG. 3 shows an alternate embodiment of the level shifting circuit part of the level translator according to the invention.

An alternate embodiment of the level shifting stage 40 is shown in FIG. 3. It is seen that in level shifting stage 47, depletion mode FET 11 has been replaced with an enhancement mode FET 16. FET 16 has its gate tied to its drain at node F, and its source coupled to receive Vee. The gate of FET 17 remains connected to node F. The configuration of level shifting stage 47 may be easier to fabricate than that of stage 40; however, circuit performance with Vcc variation suffers. In this embodiment, when Vin is a logic low, FET 12 is turned OFF and the series current flowing from Vcc to the source of FET 16 is low. In this condition, the voltage at node F nearly equals Vee and FET 16 has its Vgs and Vds both close to zero, putting FET 16 near pinchoff. Enough current needs to flow through FET 16, however, to prevent the gate of FET 17 from floating, and to assure that FET 17 remains OFF. When Vin is a logic high, FET 12 turns ON, increasing $I_{ds12}$ and pulling up the node F voltage. FET 17 turns ON, thus clamping $V_F$ to value of about Vee+0.7 V. FET 16 is then turned on hard with $V_{gs16}$ and $V_{ds16}$ both equalling 0.7 V.

Referring back to FIG. 2, the predriver stage 41 responds to the controlling voltage $V_F$ generated by the level shift stage 40 or 47 to provide the output stage 42 with controlling voltages and current. The predriver stage 41 also serves to enhance the current driving capability of the output stage. Only a single Vee supply is necessary, in contrast to conventional translator BDFL stages as in FIG. 1, which require an intermediate bias supply Vss of about $-3$ V.

Predriver stage 41 operation is as follows. Enhancement mode FET 17 has its source tied to Vee. Its drain is connected at node G to the source of FET 28, and to the gates of enhancement mode FETs 29 and 35. FETs 28, 27 arid 26 are depletion mode devices having their source to drain paths connected in series between nodes G and ground potential. Each of FETs 28, 27 and 26 have their gates tied to their respective sources so that Vgs of each device is zero. This puts each device in an ON state such that current flows in a unidirectional manner and such that Ids varies only as a function of Vds for that device. The devices then behave similar to limiters such that the voltage $V_G$ at node G Can be controlled. Although FETs 26–28 form a series chain of three depletion mode FETs, more or less than three may be employed depending on the i-v characteristics of the devices chosen. The same is true of FETs 36–38, which behave in a similar fashion to control the voltage $V_H$ at node H (node H connects the drain of FET 35 with the source of FET 38).

When $V_{IN}$ is a logic low, $V_F$ is within about 0.2 V of Vee and FET 17 is in a high resistance OFF state. FET 17 may be perceived as a series resistance in a resistive divider network, in series with resistances of FETs 26–28 between ground and Vee. With FET 17 being in a high resistance state, Ids of each FET in the chain is very low. Since Vds of each of FETs 26–28 varies along a single Ids vs. Vds curve (because Vgs of each FET is zero), Vds of each FET is then forced close to (Vee+0.7)/3 V$\approx$1.4 V. $V_G$ then becomes clamped to around $-4.3$ V. $V_{gs35}$ of FET 35, which equals $V_G$–Vee, is then about 0.7 V and FET 35 turns on. The ON resistance of FET 35 is much lower than that of FETs 36–38 resulting in $V_{ds35}$ ($V_H$–$V_{ee}$) being about 0.2 V. FETs 36–38 may then be said to be! acting as loads to provide a large voltage drop between ground potential and node H.

When $V_{IN}$ is a logic high, $V_{GS17}$ is 0.7 V and FET 17 is on thereby pulling down the voltage $V_G$ within about 0.2 V of Vee. In this condition, FETs 26–28 may be said to be acting as loads to produce a voltage drop of around 5 V between ground and node G. $V_{GS35}$ is then less than 0.7 V, turning FET 35 OFF and pushing the potential of $V_H$ towards $-4.3$ volts.

The output stage 42 is of a type known in the art and may provide complementary outputs OUTA and OUTB as shown in FIG. 2, of nominally 0 and $-5$ V. The OUTA terminal is coupled to the source of FET 34 and to the drain of FET 33; OUTB is coupled to the source of FET 24 and the drain of FET 23. The gate of FET 33 is tied to the gate of FET 29 which is at a potential of $V_G$. The gate of FET 40 is tied to the gate of FET 39 which is at a potential of $V_H$.

When Vin is a logic low, $V_G$ approaches $-4.3$ volts, thereby turning on FETs 29 and 33. By FET 33 being ON, OUTA is pulled low towards Vee, which is nominally $-5$ V. By FET 29 being ON, its drain is pulled low and a voltage drop of about 5 V occurs across the series chain of FETs 30, 31 and 32 coupled in series between ground and the drain of FET 29. The gate of FET 34, which is tied to the FET 29 drain, is pulled low such that $V_{gs34}$ is close to zero volts. With $V_{gs34}\approx$0 V, the ON resistance of FET 34 is high enough for a voltage drop of about 5 V to occur across its drain to source terminals when FET 33 is ON, FET 33 having a much lower ON resistance in this condition.

On the other hand, when $V_{IN}$ is a logic high, FET 17 is ON, $V_G$ approaches $-5$ V, and FETs 29 and 33 are OFF. FET's 29 and 33 are then in a high resistance state. FET 34 is in a low resistance state because its gate is tied to the drain of FET 29, which is high. OUTA is then a "high" of about zero volts, with about a 5 V drop occurring across $V_{gs33}$.

The complementary output OUTB is the opposite state of OUTA and is produced the same way except that $V_H$, which is inverted from $V_G$, is the controlling voltage. It is of course understood that FETs 43–45 and 30–32 are shown as chains of three depletion mode FETs but may comprise a chain of more or less than three of these devices, depending on the i-v characteristics of each device. If it is so desired for a particular application, the complementary output OUTB may be eliminated entirely by removing FETs 35–39 and 43–45 from the translator circuit.

Figure 1:
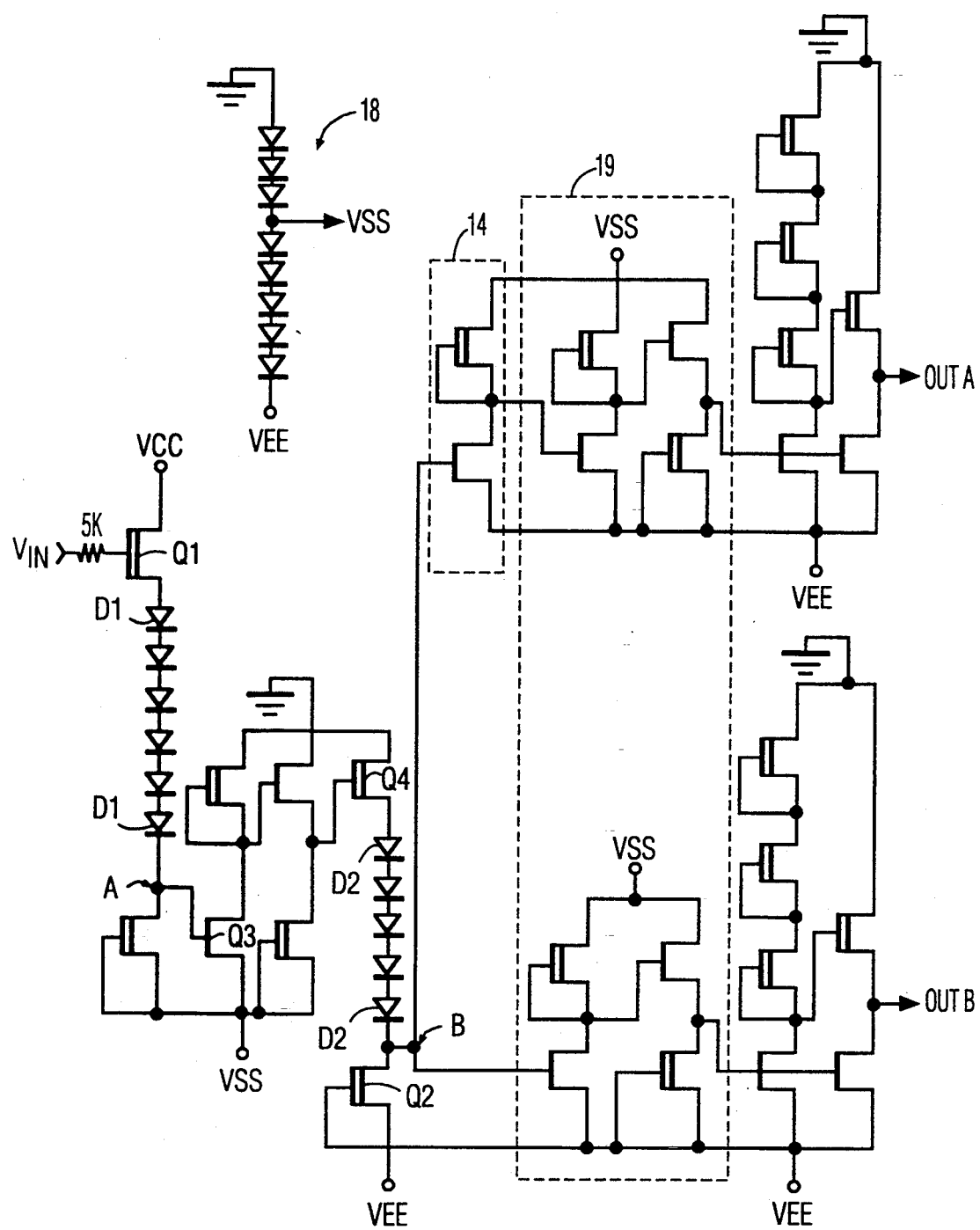
FIG. 1 shows a circuit diagram of a prior art CMOS to 0/−5 V level translator.

Table 1 shows experimental results of three wafer runs of a new translator according to the invention, in comparison to a typical prior an translator of the type shown in FIG. 1. Results are indicated at the temperature extremes of $-10°$ C. and $+80°$ C. It is apparent that the prior art translator can only operate with a Vee range of −4.00 to −5.12 V at +80° C., and that the average bias current Iee, avg is 3.0 mA. In contrast, the new translator can accommodate a Vee range of −4.01 to −5.87 V at 80° C., and Iee, avg equals 1.0 mA. A reduction in power consumption of about 62% is thus achieved. Excellent results were also achieved at −10° C. The superior sensitivity of the new translator to bias supply and temperature variations, as well as its low power consumption, is thus readily apparent.

It should be understood that while the translator according to the present invention has been described as one that translates TTL and/or CMOS logic level inputs to 0/−5 V outputs, the translator can be easily modified to translate to other output levels. For example, some microwave switching FETs can operate with control inputs of 0 and +5 V instead of 0/−5 V. These control inputs are desirable in systems that cannot accommodate a negative supply. In this case, the translator of FIG. 2 or FIG. 3 can be modified by replacing the −5 V Vee with Vee=0V; reducing the number of level shifting FETs in the level shifting stage; and by replacing all connections to ground potential with connections to the +5 V supply, i.e., Vcc. (That is, each of the drain electrodes of FETs 26, 30, 34, 36, 43 and 24 would be connected to Vcc rather than to ground potential).

From the foregoing, disclosed is an improved voltage translator apparatus for translating TTL or CMOS logic level inputs to 0/−5 V logic outputs to control microwave FETs and the like. An advantage of this translator is that proper logic level translation is achieved with large variation in bias supply over a wide temperature range. Yet another advantage of this translator is its low power consumption which is afforded by the unique circuit configuration.

It will be understood that the embodiment described herein is merely exemplary and that a person skilled in the art may make many variations and modifications without departing from the spirit and scope of the invention. All such modifications are intended to be included within the scope of the invention as a defined in the appended claims.

TABLE 1

| CONFIGURATION | ALLOWABLE RANGE OF Vee (V) | Iee, avg. (ma) | Iee, max (ma) |
|---|---|---|---|
| Prior Art Translator, −10° C. | −4.53 to −6.01 | 2.0 | 2.3 |
| Prior Art Translator, +80° C. | −4.00 to −5.12 | 3.0 | 3.3 |
| New Translator, −10° C. | −4.01 to −6.00 | 0.9 | 1.2 |
| New Translator, +80° C. | −4.02 to −5.87 | 1.0 | 1.3 |

What is claimed is:

1. In a voltage translator apparatus operative to translate a low logic level input potential to a low logic level output of a first potential, and to translate a high logic level input to a high logic level output of a second potential, the improvement therewith for providing operation insensitive to bias supply variations over a wide temperature range, comprising:

a first circuit part, having a first transistor having an input control electrode adapted to be connected to said logic level input potential, and having a first and second output electrode with said first output electrode adapted to be connected to a third source of operating potential, and with said second output electrode coupled to a first series string of transistors each connected to conduct current in a unidirectional manner, wherein said third potential is level shifted to a fourth potential at a first circuit node, the magnitude of said fourth potential being a function of the magnitude of said logic level input potential;

a second circuit part, having a second transistor having a second input control electrode coupled to said first circuit node, and having third and fourth output electrodes, wherein a fifth source of operating potential is applied to said third electrode, said fourth electrode is coupled to a second series string of at least one transistor each connected to conduct current in a unidirectional manner, said second series string being coupled to a point of reference potential, said second circuit part providing a sixth potential at a second circuit node, wherein the magnitude of said sixth potential is a function of the magnitude of said fourth potential; and an output stage having at least one transistor adapted to be connected to said fifth source of operating potential, and having at least one other transistor coupled to a point of reference potential, said output stage coupled to said second circuit node, and providing said low and high logic level output potentials in accordance with the magnitude of said sixth potential.

2. The apparatus according to claim 1, wherein said output stage provides a complementary output of said second potential when said logic level input is low, and of said first potential when said logic level input is high.

3. The apparatus according to claim 1 wherein said transistors are MESFET devices.

4. The apparatus according to claim 1 wherein said transistors are MOSFET devices.

5. The apparatus according to claim 1 wherein said low logic level input potential is in the range of zero to about one volt, and said high logic level input potential is in the range from about two volts to five volts.

6. The apparatus according to claim 1 wherein said first potential is about minus five volts and said second potential is about zero volts.

7. The apparatus according to claim 1 wherein said first circuit part comprises:

a first FET having a gate electrode coupled to a first terminal of a resistor, a drain electrode coupled to said third source of potential, anal a source electrode coupled to the drain electrode of a second FET, said resistor having a second terminal coupled to receive said logic level input potential;

said second FET being the first in a series string of level shifting FETs coupled in series between said source electrode of said first FET and the drain electrode of a third enhancement mode FET, each of said level shifting FETs having its gate electrode coupled to its drain electrode and having its drain electrode coupled to the source electrode of a prior FET in said string, and having its source electrode coupled to the drain electrode of a next FET in said string;

the drain electrode of said third FET being coupled to the source electrode of a last FET in said string, the source of said third FET being connectable to said fifth source of potential, said third FET having its gate electrode coupled to its drain electrode;

whereby a voltage drop occurs across the drain electrode to source electrode of each of said level shifting FETs and across the drain electrode to source electrode of said first FET such that said drain electrode of said third FET is at said fourth potential, said drain electrode of said third FET being coupled to said first circuit node.

8. The apparatus according to claim 7 wherein said FETs are n-channel enhancement mode FETs.

9. The apparatus according to claim 1 wherein said first circuit part comprises:
a first FET having a gate electrode coupled to a first terminal of a resistor, a drain electrode coupled to said third source of potential, and a source electrode coupled to the drain electrode of a second FET, said resistor having a second terminal coupled to receive said logic level input potential;
said second FET being the first in a series string of level shifting FETs coupled in series between said source electrode of said first FET and the drain electrode of a third enhancement node FET, each of said level shifting FETs having its gate electrode coupled to its drain electrode and having its drain electrode coupled to the source electrode of a prior FET in said string, and having its source electrode coupled to the drain electrode of a next FET in said string;
the drain electrode of said third FET being coupled to the source electrode of a last FET in said chain, the gate electrode of said third FET being coupled to its source electrode wherein said fifth source of potential is applied to said source electrode of said third FET;
whereby a voltage drop occurs across the drain electrode to source electrode of each of said level shifting FETs and across the drain electrode to source electrode of said first FET such that said drain electrode of said third FET is at said fourth potential, said drain electrode of said third FET being coupled to said first circuit node.

10. The apparatus according to claim 1 wherein said second circuit part comprises:
a first enhancement mode FET having a source electrode connectable to said fifth source of potential, a gate electrode coupled to said first circuit node to receive said fourth potential, and a drain electrode;
at least one depletion mode FET for loading said first FET, coupled in series between ground potential and said drain of said first FET, each of said at least one depletion mode FETs having its gate coupled to its source;
wherein said first FET is responsive to the magnitude of said fourth potential, and wherein voltage drops occur across the drain to source of each of said at least one depletion mode FETs, the magnitude of said voltage drops being dependent upon said magnitude of said fourth potential, such that said drain of said first FET is at said sixth potential.

11. The apparatus according to claim 10 wherein said second circuit part further comprises:
a second enhancement mode FET having a gate electrode coupled to said drain electrode of said first FET, a source electrode coupled to said fifth source of potential, and a drain electrode;
at least one other depletion mode FET for loading said second FET, coupled in series between a point of reference potential and said drain electrode of said second FET, each of said at least one other depletion mode FETs having a gate electrode coupled to a source electrode;
wherein said second FET is responsive to the magnitude of said sixth potential such that the drain of said second FET is at a seventh potential, said drain electrode of said second FET being coupled to a third circuit node within said second circuit part.

12. The apparatus according to claim 1 wherein said output stage comprises a first enhancement mode FET having a gate electrode coupled to said second circuit node to receive said sixth potential, a source electrode coupled to said fifth source of potential, and a drain electrode;
an output enhancement mode FET having a source electrode coupled to said fifth source of potential, an output depletion mode FET having a drain electrode coupled to a point of reference potential, a source electrode coupled to said drain electrode of said output enhancement mode FET and a gate electrode coupled to said drain electrode of said first enhancement mode FET;
at least one other depletion mode FET for loading said first FET, coupled in series between said drain electrode of said first FET and a point of reference potential, each of said other depletion mode FETs having a gate electrode coupled to a source electrode;
whereby said first and output enhancement mode FETs are responsive to the magnitude of said sixth potential, said low and high outputs are a function of said sixth potential and occur at said drain of said output enhancement mode FET.

13. The apparatus according to claim 11 wherein said output stage comprises:
a third enhancement mode FET having a gate electrode coupled to said second circuit node to receive said sixth potential, a source electrode connectable to said fifth source of potential, and a drain electrode;
a fourth output enhancement mode FET having a source electrode connectable to said fifth source of potential, a gate electrode coupled to said second circuit node, and a drain electrode;
a fifth output depletion mode FET having a drain electrode connectable to said point of reference potential, a source electrode coupled to said drain electrode of said fourth output enhancement mode FET and a gate electrode coupled to said drain electrode of said third enhancement mode FET;
at least one other depletion mode FET for loading said third FET, coupled in series between said drain electrode of said third FET and said point of reference potential, each of said other depletion mode FETs having a gate electrode coupled to a source electrode;
a sixth enhancement mode FET having a source electrode coupled to said fifth source of potential, a gate electrode coupled to said third circuit node, and a drain electrode;
a string of at least one depletion mode FET, coupled in series between said point of reference potential and said drain electrode of said sixth enhancement mode FET, each of said FETs in said string having a gate electrode coupled to a source electrode;
a seventh output enhancement mode FET having a source electrode connectable to said fifth source of potential, a gate electrode coupled to said third circuit node, and a drain electrode;

an eighth output depletion mode FET having drain electrode coupled to said point of reference potential, a source electrode coupled to said drain electrode of said seventh output enhancement mode FET, and a gate electrode coupled to said drain electrode of said sixth FET;

wherein said third and fourth enhancement mode FETs are responsive to the magnitude of said sixth potential such that said low and high outputs occur at said drain of said fourth output enhancement mode FET, and wherein said sixth and seventh FETs are responsive to the magnitude of said seventh potential such that a complementary output is provided at said drain electrode of said seventh FET, said complementary output being of said second potential when said logic level input is low, and of said first potential when said logic level input is high.

14. The apparatus according to claim 1 wherein said wide temperature range is from −10° C. to +80° C.

15. The apparatus according to claim 1 wherein said first potential is about zero volts and said second potential is about five volts.

16. The apparatus according to claim 1 wherein said magnitude of said fourth potential is about −5 volts when said logic level input is low, and about −4.3 volts when said logic level input is high.

17. The translator apparatus according to claim 1 wherein said apparatus is of low power consumption and operates with a current draw of about one milliampere.

18. The apparatus according to claim 1 wherein said logic level input potentials are TTL logic level input potentials.

19. The apparatus according to claim 1 wherein said logic level input potentials are CMOS logic level input potentials.

* * * * *